United States Patent
Chen (10) Patent No.: US 11,778,770 B1
(45) Date of Patent: Oct. 3, 2023

(54) SYNCHRONIZING AND LOCKING MECHANISM OF SERVER SLIDE RAIL

(71) Applicant: MARTAS PRECISION SLIDE CO., LTD., New Taipei (TW)

(72) Inventor: Wan-Lai Chen, New Taipei (TW)

(73) Assignee: MARTAS PRECISION SLIDE CO., LTD., New Taipei (TW)

( * ) Notice: Subject to any disclaimer, the term of this patent is extended or adjusted under 35 U.S.C. 154(b) by 0 days.

(21) Appl. No.: 17/939,935

(22) Filed: Sep. 7, 2022

(51) Int. Cl.
| | | |
|---|---|---|
| A47B 88/00 | (2017.01) | |
| A47B 88/49 | (2017.01) | |
| H05K 7/14 | (2006.01) | |
| A47B 88/493 | (2017.01) | |
| A47B 88/57 | (2017.01) | |

(52) U.S. Cl.
CPC .......... H05K 7/1489 (2013.01); A47B 88/49 (2017.01); A47B 88/493 (2017.01); A47B 88/57 (2017.01); *A47B 2210/007* (2013.01); *A47B 2210/0081* (2013.01)

(58) Field of Classification Search
CPC .... H05K 7/1489; A47B 88/49; A47B 88/493; A47B 88/57; A47B 2210/007; A47B 2210/0081; A47B 88/443; A47B 2210/0016
See application file for complete search history.

(56) References Cited

U.S. PATENT DOCUMENTS

| | | | | |
|---|---|---|---|---|
| 8,585,166 | B2 * | 11/2013 | Chen | A47B 88/493 312/334.46 |
| 9,538,845 | B1 * | 1/2017 | Chen | A47B 88/49 |
| 10,041,535 | B2 * | 8/2018 | Chen | H05K 7/183 |
| 10,463,149 | B1 * | 11/2019 | Chen | A47B 88/473 |
| 10,610,015 | B2 * | 4/2020 | Chen | F16C 29/10 |
| 10,736,422 | B2 * | 8/2020 | Chen | A47B 88/49 |
| 11,149,789 | B2 * | 10/2021 | Tang | F16C 29/008 |
| 2006/0120636 | A1 * | 6/2006 | Chen | A47B 88/443 384/18 |
| 2015/0270665 | A1 * | 9/2015 | Chen | A47B 88/49 439/121 |
| 2018/0031037 | A1 * | 2/2018 | Chen | F16C 29/10 |
| 2019/0082836 | A1 * | 3/2019 | Chen | A47B 88/49 |
| 2020/0107636 | A1 * | 4/2020 | Chen | H05K 7/183 |
| 2021/0148404 | A1 * | 5/2021 | Tang | A47B 88/44 |

FOREIGN PATENT DOCUMENTS

TW   202025945 A   * 7/2020

* cited by examiner

*Primary Examiner* — Kimberley S Wright
(74) *Attorney, Agent, or Firm* — Fei-hung Yang (57) ABSTRACT

A synchronizing and locking mechanism of a server slide rail includes a middle rail installing structure, an operating plate, an outer rail locking structure and an inner rail synchronous locking structure. The middle rail installing structure is formed on the middle rail and includes an installing part and a through hole. The operating plate is installed to the installing part and has first and second elastic plates, and the first elastic plate has a middle/outer rail locking stop point, an inner rail releasing outer rail locking hook and a pull operation part, and the second elastic plate has an inner/middle rail synchronous stop point and a jack-up part. The outer rail locking structure is installed to the outer rail and includes an outer rail locking hole. The inner rail synchronous locking structure is installed to the inner rail and includes an inner rail locking hole and a synchronous hook.

6 Claims, 9 Drawing Sheets

SYNCHRONIZING AND LOCKING MECHANISM OF SERVER SLIDE RAIL

BACKGROUND

Technical Field

The present disclosure relates to the field of a server slide rail structure, and more particularly relates to a synchronizing and locking mechanism of a server slide rail that includes a middle rail installing structure, an operating plate, an outer rail locking structure and an inner rail synchronous locking structure, and has the functions of simplifying the structure and synchronously locking the inner and middle rails with the outer rail, so as to achieve the effects of lowering the manufacturing and assembling cost and improving the convenience of operation.

Description of Related Art

In general, a common industrial computer cabinets used for carrying servers are vertically divided into a plurality of separate installation spaces according to space requirements, so that the servers can be installed in the separate spaces without interfering with one another. Therefore, the servers can be installed in the industrial computer cabinet through the sliding rails to facilitate application and maintenance, and the servers can be pulled out sequentially through the sliding rails.

Since the structure of these slide rails generally includes an outer rail, a middle rail, an inner rail and two slip-assist elements, and the outer rail is usually fixed onto the industrial computer cabinet, and the inner rail is fixed onto the servers, and the middle rail is used together with the slip-assist element such as a ball bearing or a roller and connected between the outer rail and the middle rail, and between the middle rail and the inner rail, so that the inner rail and the middle rail can be pushed or pulled reciprocally along the same axial direction relative to the outer rail, thereby significantly improving the push-in and pull-out sliding movements and saving the storage space.

However, the operation of these slide rails often encounters the following problems. The inner rail, the middle rail and the outer rail are driven by the slip-assist elements and cannot be moved according to a specific sequence, and the sliding movement is unsmooth, and thus most slide rails are designed with a synchronous mechanism. In this way, when the server slide rail is operated, the inner rail together with the middle rail can be pulled out from the outer rail, and after the middle rail is pulled out completely from the outer rail, the inner rail is pulled out from the middle rail to reach a full extension, and can be positioned at the fully extended position, and when the inner rail is retracted, the positioned state of the middle rail can be released, so that the middle rail can be retracted synchronously. However, most of such structural designs have the synchronization function when the railed is pulled out in one direction. Although they have the synchronization effect when the rail is pushed in and stored, there is no locking function. After the rail is fully extended and if an external force is exerted onto the rail, the rail may be pushed in during the using process which may have a potential risk of pinching the users, and the middle rail may be damaged during the pushing process. Therefore, how to make the middle rail and the inner rail to have the two-way synchronous action, and how to keep the locked state after the slide rails are locked in order to prevent the users from being pinched and prevent the slide rail from being damaged due to accidental touch or impact are long-standing problems that need to be solved.

In view of the aforementioned drawbacks of the related art, this discloser conducted extensive research and experiment, and finally proposed a synchronizing and locking mechanism of a server slide rail to greatly simplify the mechanical structure and lower the assembling and manufacturing cost, while providing a bi-directional synchronization function, and after the slide rails are pulled out completely, they can be locked, and this disclosure concurrently takes the smooth operation during the operation process and the stability of use into account.

SUMMARY

Therefore, it is a primary objective of the present disclosure to provide a synchronizing and locking mechanism of a server slide rail, and the synchronizing and locking mechanism includes a middle rail installing structure, an operating plate, an outer rail locking structure and an inner rail synchronous locking structure. The middle rail installing structure is formed on the middle rail and includes an installing part and a through hole. The operating plate is installed to the installing part and has first and second elastic plates, and the first elastic plate has a middle/outer rail locking stop point, an inner rail releasing outer rail locking hook and a pull operation part, and the second elastic plate has an inner/middle rail synchronous stop point and a jack-up part. The outer rail locking structure is installed to the outer rail and includes an outer rail locking hole. The inner rail synchronous locking structure is installed to the inner rail and includes an inner rail locking hole and a synchronous hook. The synchronizing and locking mechanism can achieve the effects of synchronizing the inner and middle rails, locking the middle and outer rails locking, reducing the manufacturing and assembling cost and improving the convenience of operation.

To achieve the aforementioned and other objectives, this disclosure discloses a synchronizing and locking mechanism of a server slide rail, and the server slide rail being sequentially formed by an inner rail, a first slip-assist element, a middle rail, an outer rail and a second slip-assist element, and the synchronizing and locking mechanism including: a middle rail installing structure, formed on the middle rail by stamping, and including an installing part and a through hole, and the through hole having a height limiting stop point inwardly extended from the periphery thereof and, and the installing part having an installing hole; an operating plate, having a fixing hole formed at an end thereof and disposed in the installing hole, and the other end of the operating plate having a first elastic plate and a second elastic plate configured and extended side by side with each other, and the first elastic plate having a middle/outer rail locking stop point and an inner rail releasing outer rail locking hook, and an end of the first elastic plate being provided with a pull operation part, and the second elastic plate having an inner/middle rail synchronous stop point and a jack-up part, and the height limiting stop point stopping a swing angle of the first elastic plate to avoid disabling the first elastic plate; an outer rail locking structure, formed on the outer rail by stamping, and including an outer rail locking hole, such that after being linked and operated by the server slide rail, the middle/outer rail locking stop point is engaged with the outer rail locking hole to define the locked state between the middle and outer rails, and the pull operation part can be pulled manually to release the middle/outer rail locking stop point for unlock; and an inner rail synchronous locking structure, formed on the inner rail by stamping, and including an inner rail locking hole and a synchronous hook, and the inner rail locking hole being configured to be corresponsive to the first elastic plate, and the synchronous hook being configured to be corresponsive to the second elastic plate, such that after being operated by the server slide rail, the inner rail releasing outer rail locking hook is engaged with the inner rail locking hole to define a locked state between the middle and inner rails, and the inner/middle rail synchronous stop point is engaged with the synchronous hook to form a synchronous movement of the inner rail and the middle rail, and a side of the inner rail locking hole corresponding to the inner rail releasing outer rail locking hook being provided with a release hook.

In an embodiment of this disclosure, the middle/outer rail locking stop point is protruded from a corresponding side of the outer rail, and the inner rail releasing outer rail locking hook is formed by outwardly extending and bending a outer side edge of the first elastic plate and configured to be corresponsive to a side of the inner rail, and the inner rail releasing outer rail locking hook has an inclined plane, such that when the pull operation part is pulled manually, the inclined plane will move along the release hook to drive the first elastic plate to swing in the opposite direction, so as to separate the inner rail releasing outer rail locking hook from the limitation of the inner rail locking hole for unlock. In addition, the jack-up part is disposed on an inner side edge of the second elastic plate, and the inner/middle rail synchronous stop point is disposed on an outer side edge of the second elastic plate, and the inner/middle rail synchronous stop point is extended outwardly after being bent to form a reinforced sidewall by stamping, and the jack-up part normally abuts against a side of the outer rail to swing the second elastic plate towards the inner rail, such that the inner/middle rail synchronous stop point and the synchronous hook are engaged to define a synchronous state.

In another embodiment of this disclosure, the synchronizing and locking mechanism of a server slide rai further includes a reinforced side edge formed on another side edge of the first elastic plate with the inner rail releasing outer rail locking hook by stamping, and the middle/outer rail locking stop point is disposed between the reinforced side edge and the inner rail releasing outer rail locking hook. In addition, the synchronizing and locking mechanism of a server slide rail of this disclosure further includes an operating hole formed and spaced from a side of the through hole, and the operating hole is configured to be corresponsive to the pull operation part to facilitate an operator's finger to put into the operating hole to carry out an operation of the pull operation part.

It is noteworthy that the synchronous hook of this disclosure is protruded from a side of the inner rail facing the middle rail by stamping, and two ends of the synchronous hook corresponding to the moving path of the inner/middle rail synchronous stop point are curved in shape, such that the inner/middle rail synchronous stop point can be separated from the engagement with the synchronous hook more easily. In addition, the synchronizing and locking mechanism of a server slide rail of this disclosure further includes a pair of reinforced parts respectively formed on two sides of the middle rail corresponding to the through hole by stamping.

DESCRIPTION OF THE EMBODIMENTS

This disclosure will now be described in more detail with reference to the accompanying drawings that show various embodiments of this disclosure.

With reference to FIGS. 1, 2 and 3 to 9 for the exploded views of a preferred embodiment of this disclosure viewing at two different viewing angles and the schematic views of different states during the operation of the preferred embodiment of this disclosure respectively, a synchronizing and locking mechanism 2 of a server slide rail 1 in accordance with this disclosure includes a middle rail installing structure 21, an operating plate 22, an outer rail locking structure 23 and an inner rail synchronous locking structure 24, which are installed into the server slide rail 1, and the server slide rail 1 is sequentially formed by an inner rail 11, a first slip-assist element 12, a middle rail 13, an outer rail 14 and a second slip-assist element 15.

Figure 1:
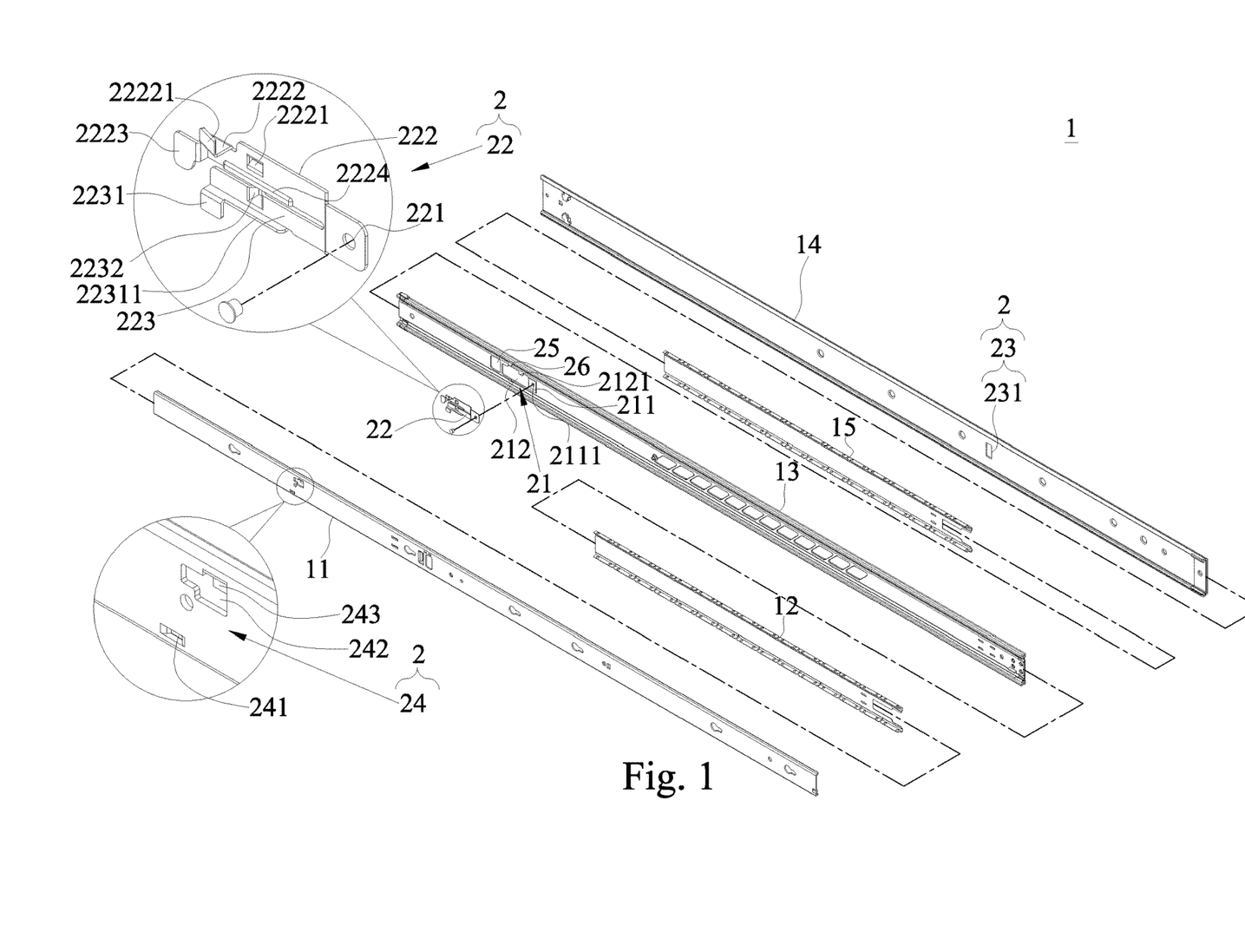
FIG. 1 is an exploded view of the structure of a preferred embodiment of this disclosure.
Figure 2:
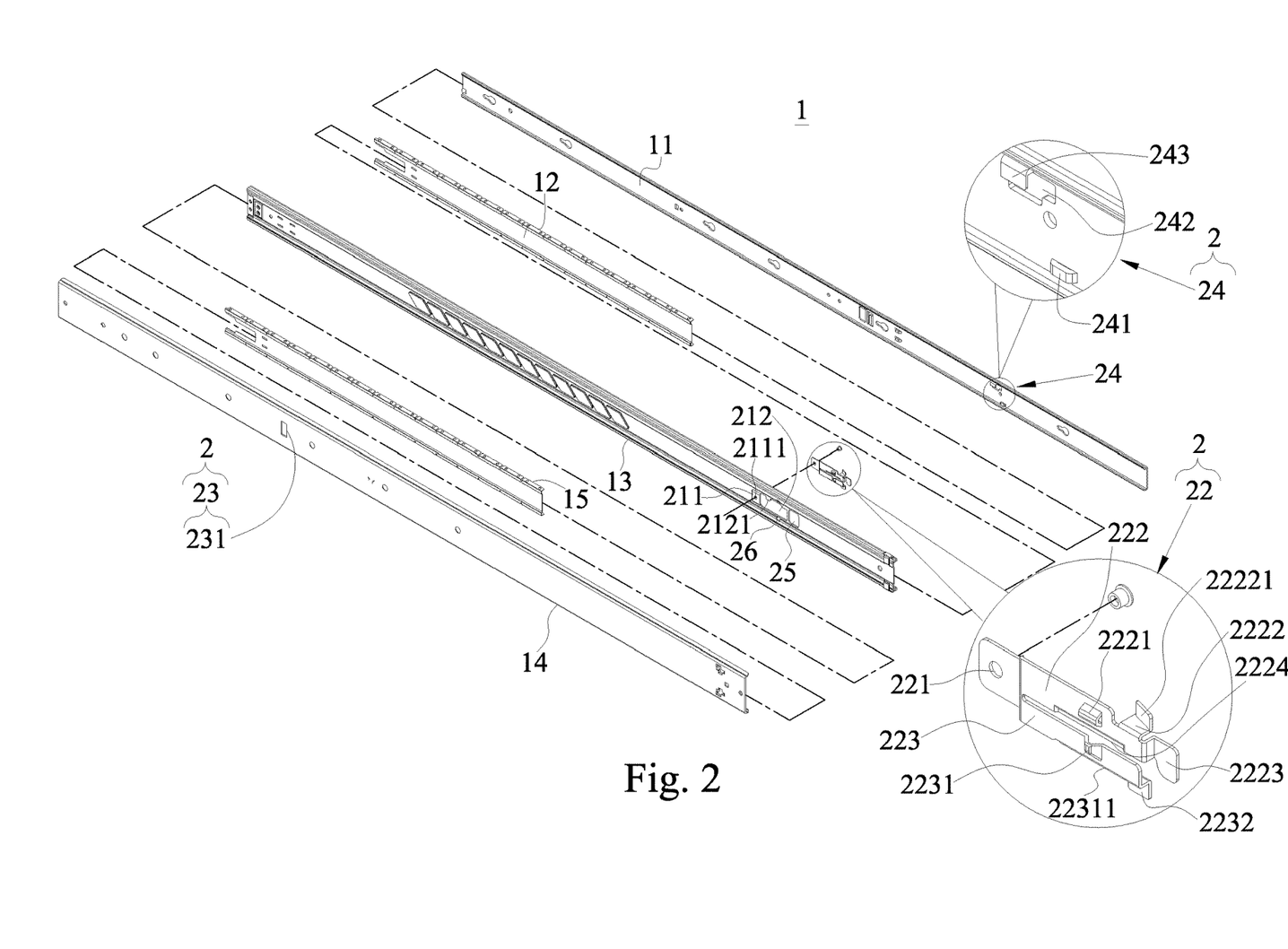
FIG. 2 is an exploded view of the structure of a preferred embodiment of this disclosure, viewing from another angle.
Figure 3:
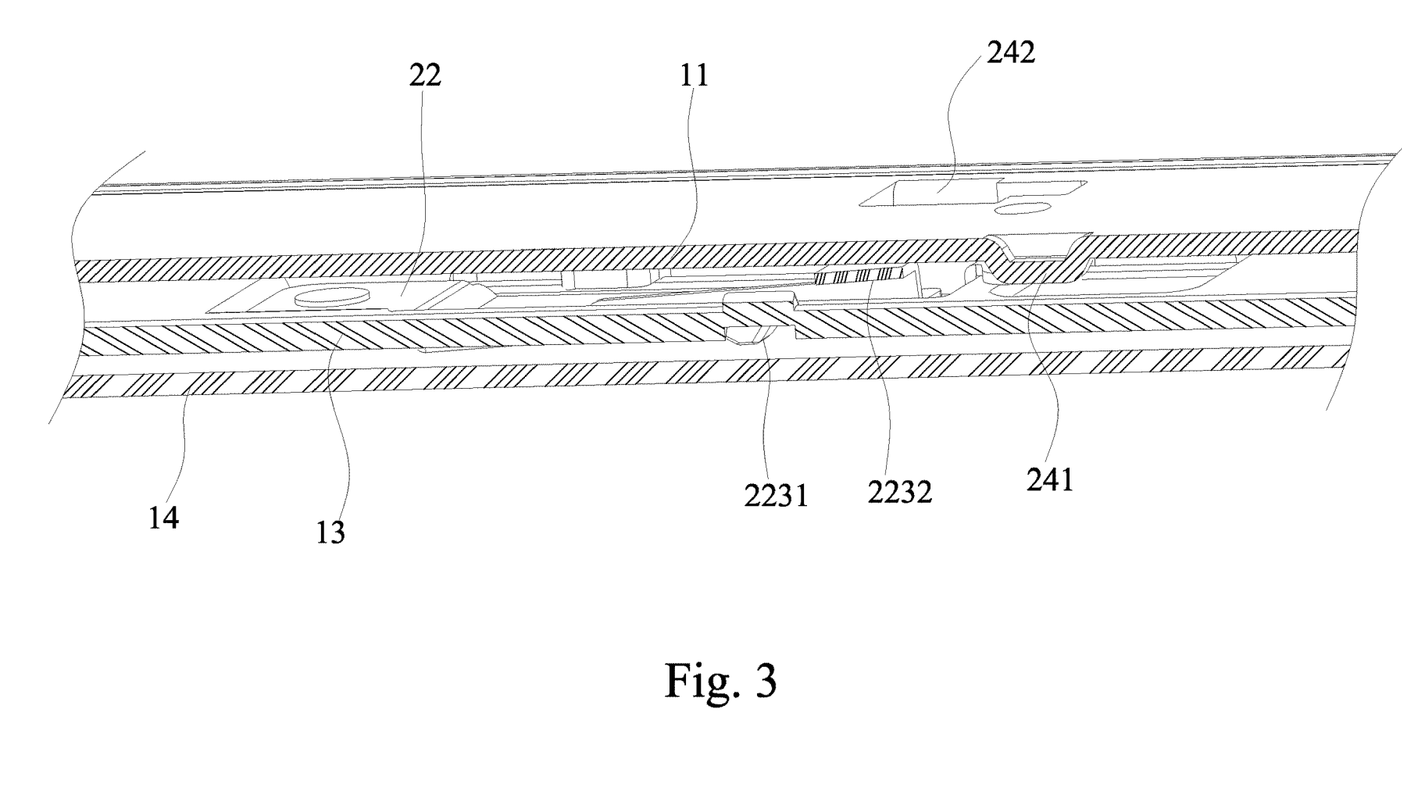
FIG. 3 is a first schematic view showing the operation of a preferred embodiment of this disclosure.
Figure 4:
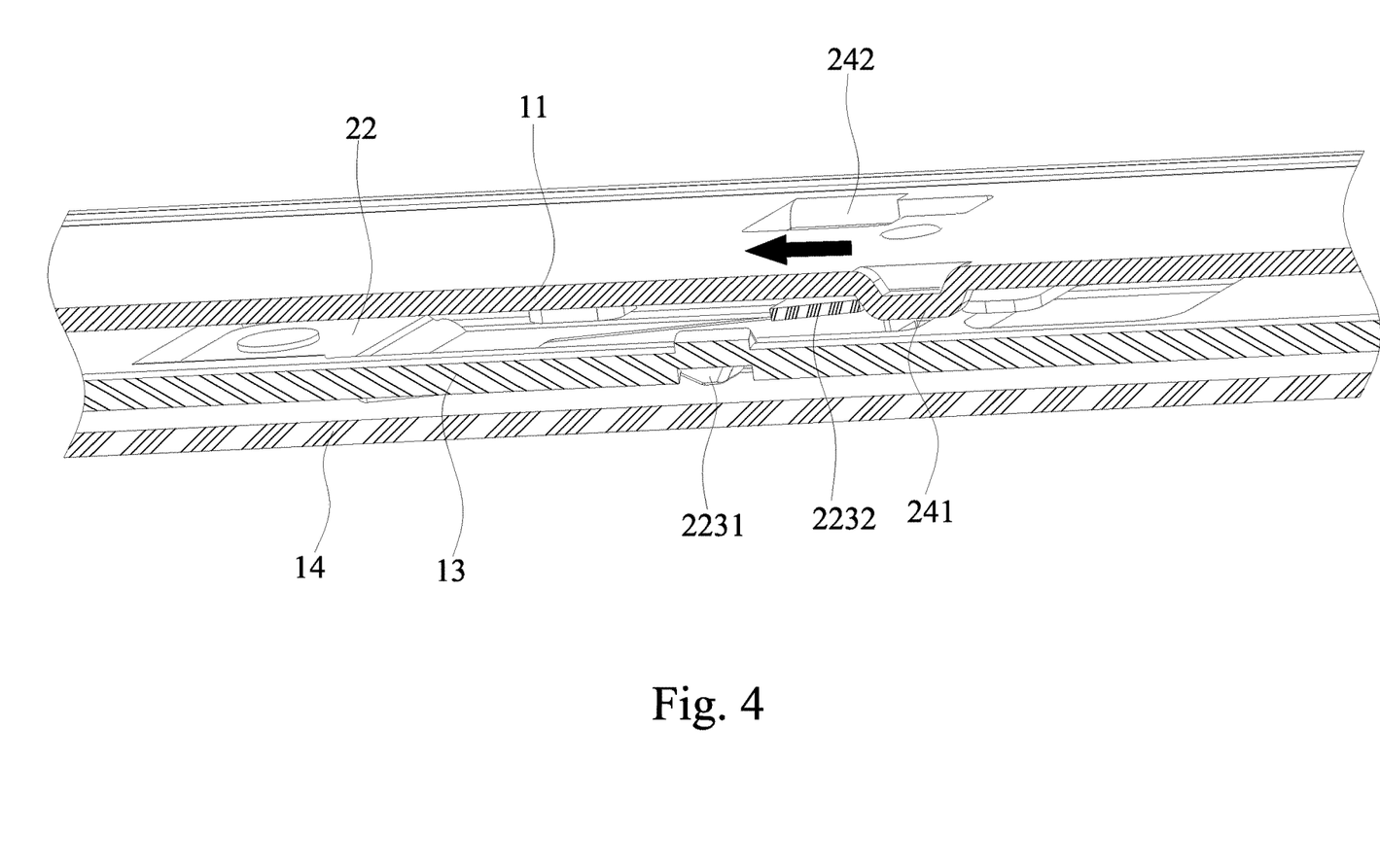
FIG. 4 is a second schematic view showing the operation of a preferred embodiment of this disclosure.
Figure 5:
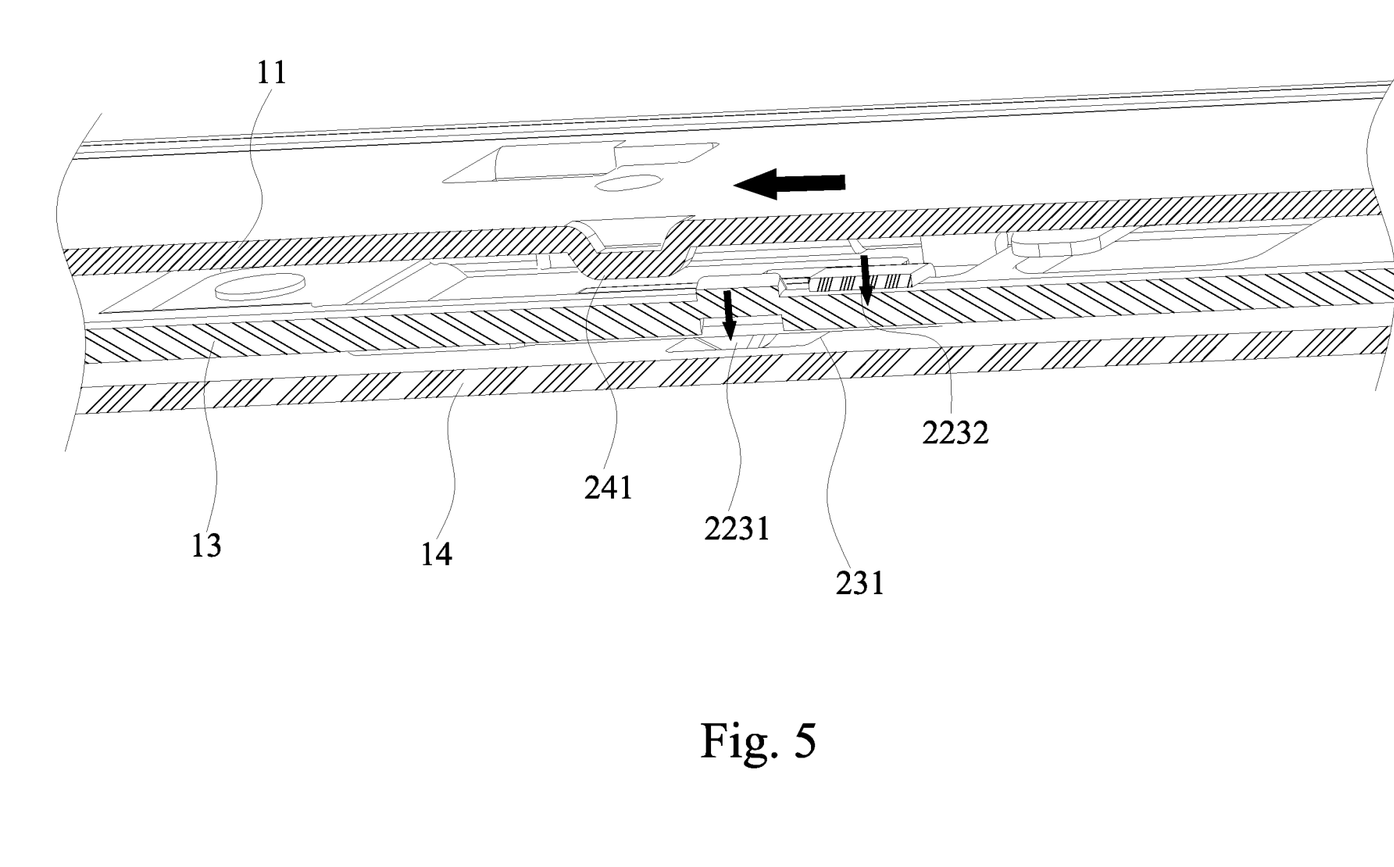
FIG. 5 is a third schematic view showing the operation of a preferred embodiment of this disclosure.
Figure 6:
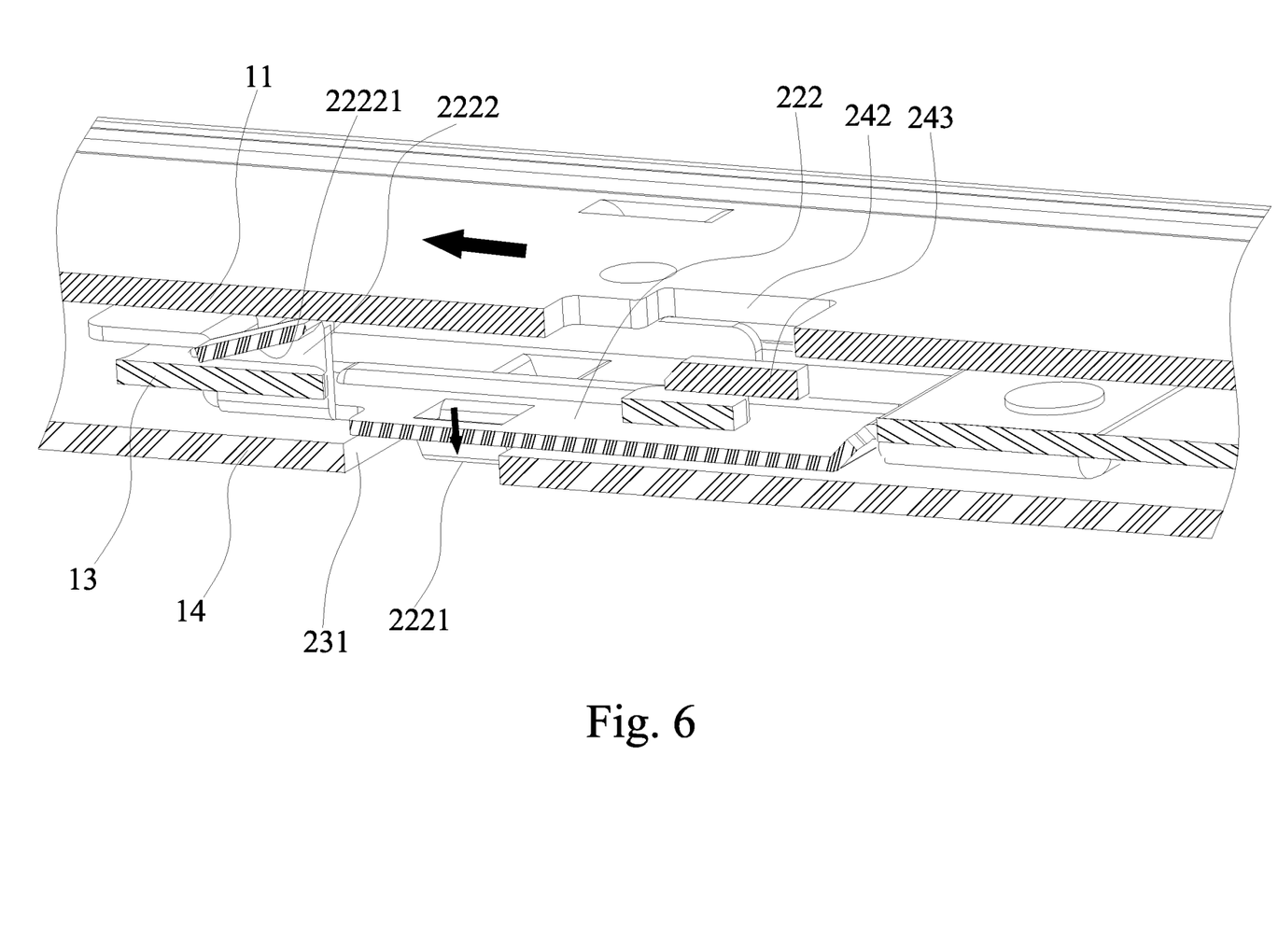
FIG. 6 is a fourth schematic view showing the operation of a preferred embodiment of this disclosure.
Figure 7:
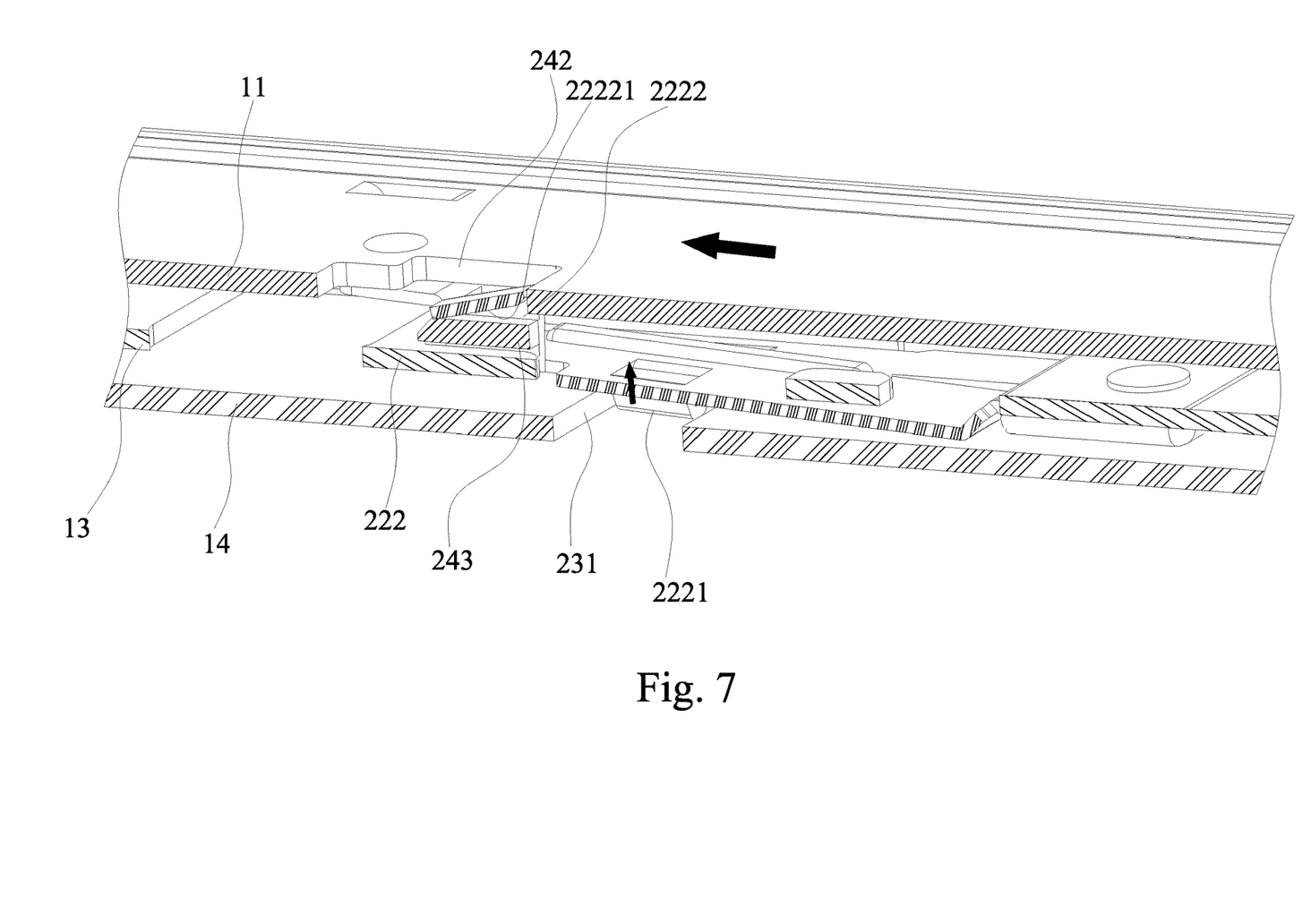
FIG. 7 is a fifth schematic view showing the operation of a preferred embodiment of this disclosure.
Figure 8:
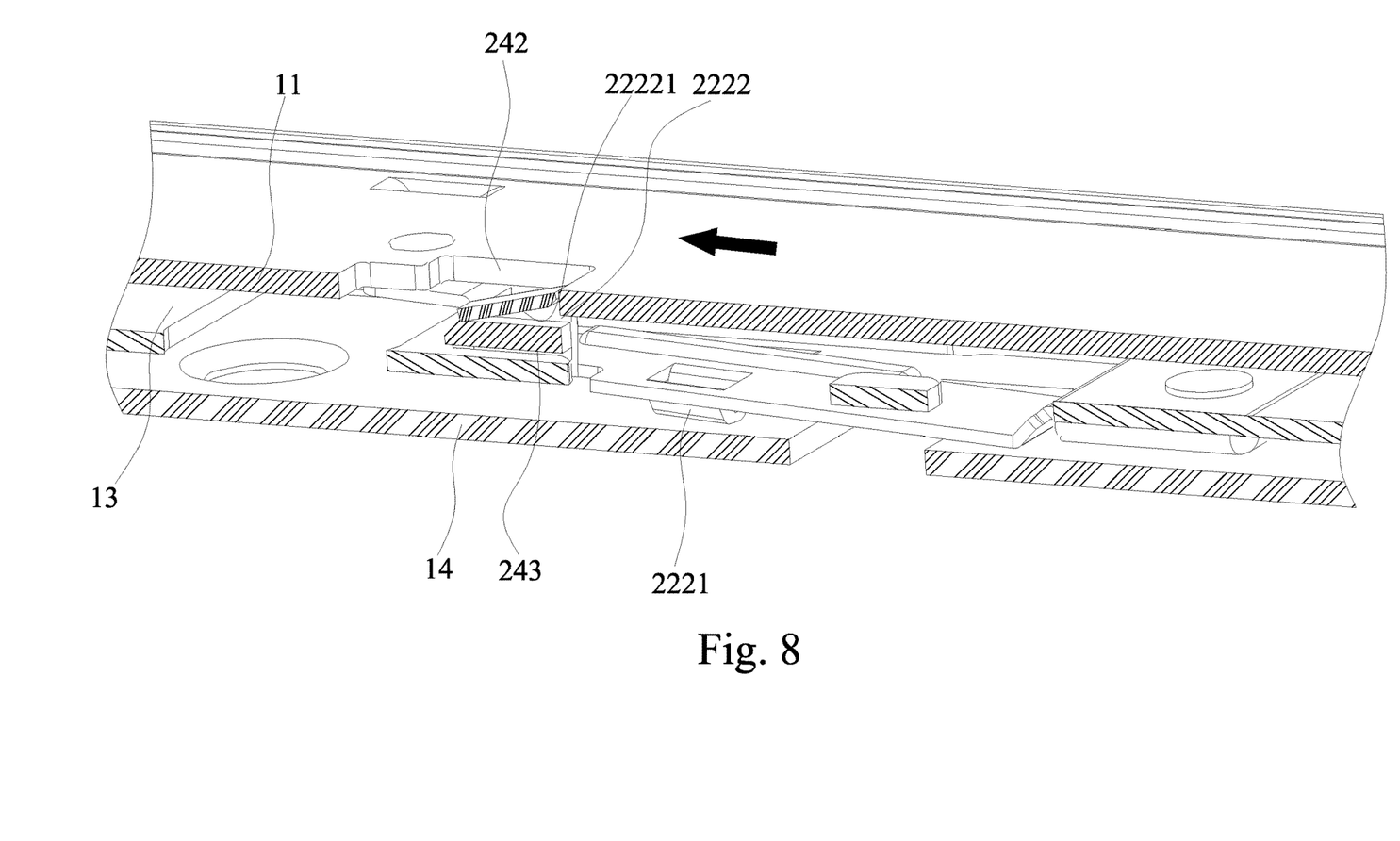
FIG. 8 is an eighth schematic view showing the operation of a preferred embodiment of this disclosure.
Figure 9:
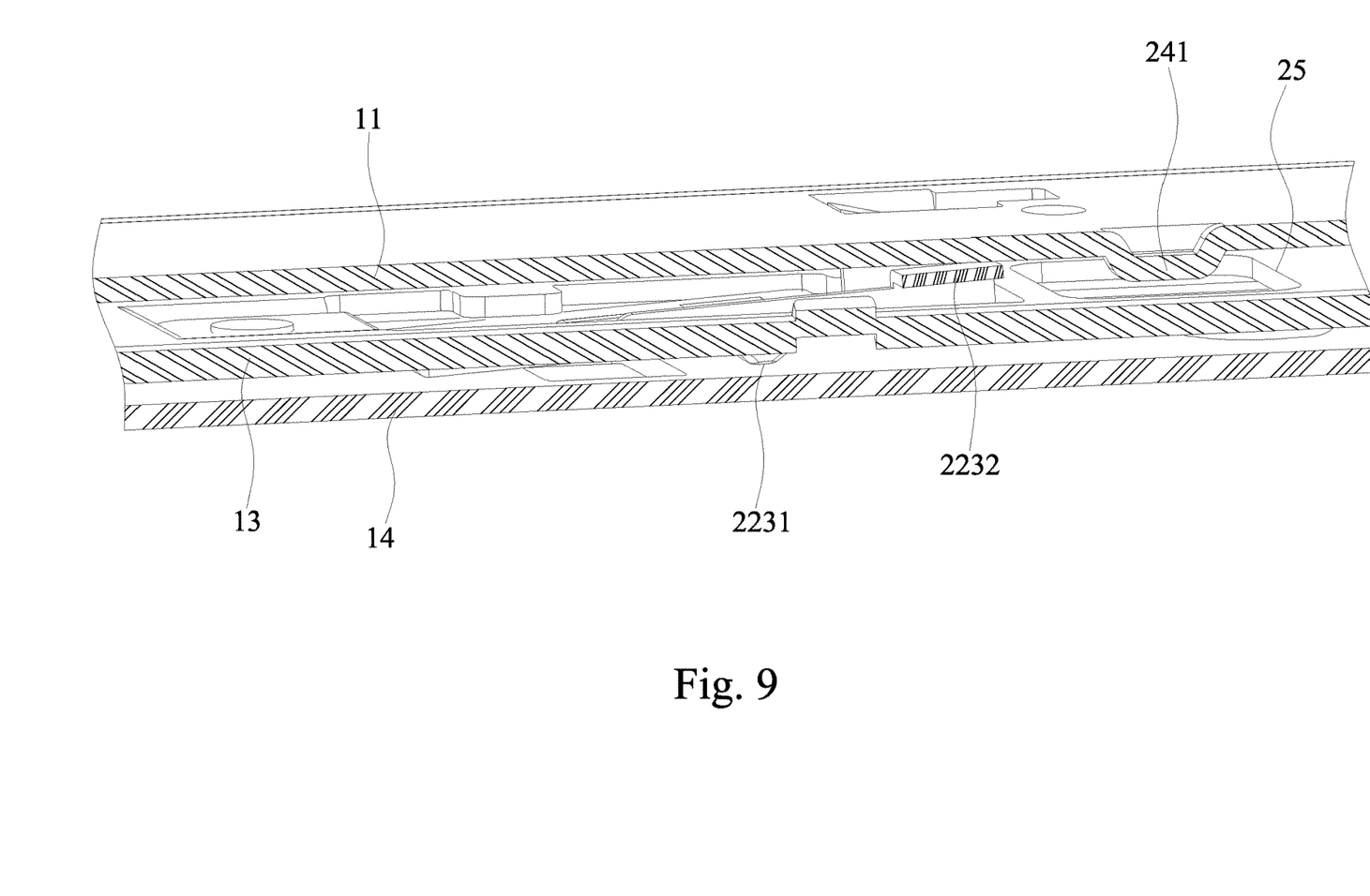
FIG. 9 is a ninth schematic view showing the operation of a preferred embodiment of this disclosure.

Wherein, the middle rail installing structure 21 is formed on the middle rail 13 by stamping, and the middle rail installing structure 21 includes an installing part 211 and a through hole 212, and the through hole 212 has a height limiting stop point 2121 inwardly extended from the periphery of the through hole 212, and the installing part 211 has an installing hole 2111.

The operating plate 22 has a fixing hole 221 formed at an end of the operating plate 22 and disposed in the installing hole 2111, and the other end of the operating plate 22 has a first elastic plate 222 and a second elastic plate 223 configured and extended side by side with each other, and the first elastic plate 222 has a middle/outer rail locking stop point 2221 and an inner rail releasing outer rail locking hook 2222, and its end has a pull operation part 2223, and the second elastic plate 223 has an inner/middle rail synchronous stop point 2231 and a jack-up part 2232, and the height limiting stop point 2121 is provided for stopping a swing angle of the first elastic plate 222 to avoid disabling the first elastic plate 222. It is noteworthy that the middle/outer rail locking stop point 2221 of this disclosure is protruded from a corresponding side of the outer rail 14, and the inner rail releasing outer rail locking hook 2222 is formed by outwardly extending and bending a side edge of the first elastic plate 222 and configured to be corresponsive to a side of the inner rail 11, and the jack-up part 2232 is disposed at an inner side edge of the second elastic plate 223, and the inner/middle rail synchronous stop point 2231 is disposed at an outer side edge of the second elastic plate 223, and the inner/middle rail synchronous stop point 2231 is extended outwardly after being bent to form a reinforced sidewall 22311 by stamping, and the first elastic plate 222 has a reinforced side edge 2224 formed at the other side edge of the inner rail releasing outer rail locking hook 2222 by stamping, so that the middle/outer rail locking stop point 2221 is disposed between the reinforced side edge 2224 and the inner rail releasing outer rail locking hook 2222. In addition, the synchronizing and locking mechanism 2 of this disclosure further includes an operating hole 25 formed and spaced from a side of the through hole 212, and the operating hole 25 is configured to be corresponsive to the pull operation part 2223 to facilitate an operator's finger to put into the operating hole to carry out an operation of the pull operation part.

The outer rail locking structure 23 is formed on the outer rail 14 by stamping, and the outer rail locking structure 23 includes an outer rail locking hole 231, so that after being linked by the server slide rail 1, the middle/outer rail locking stop point 2221 is engaged with the outer rail locking hole 231 to define a locked state between the middle rail 13 and the outer rail 14, and the pull operation part 2223 can be pulled manually to release the middle/outer rail locking stop point 2221 for unlock.

The inner rail synchronous locking structure 24 is formed on the inner rail 11 by stamping, and the inner rail synchronous locking structure 24 includes an inner rail locking hole 241 and a synchronous hook 242, and the inner rail locking hole 241 is configured to be corresponsive to the first elastic plate 222, and the synchronous hook 242 is configured to be corresponsive to the second elastic plate 223, so that after being operated by the server slide rail 2, the inner rail releasing outer rail locking hook 2222 is engaged with the inner rail locking hole 241 to define a locked state between the middle rail 13 and the inner rail 11, and the inner/middle rail synchronous stop point 2231 is engaged with the synchronous hook 242 to provide a synchronous movement of the inner rail 11 and the middle rail 13. In addition, a side of the inner rail locking hole 241 corresponding to the inner rail releasing outer rail locking hook 2222 has a release hook 243. It is noteworthy that the inner rail releasing outer rail locking hook 2222 has an inclined plane 22221, so that when the pull operation part 2223 is pulled manually, the inclined plane 22221 will move along the release hook 243 and drive the first elastic plate 222 to swing in an opposite direction, so as to release the inner rail releasing outer rail locking hook 2222 from the limitation of the inner rail locking hole 241 for unlock. In addition, the jack-up part 2232 normally abuts against a side of the outer rail 14, so that the second elastic plate 223 swings towards the inner rail 11, and the inner/middle rail synchronous stop point 2231 and the synchronous hook 242 are engaged with each other to define a synchronous state. In this embodiment, the synchronous hook 242 is protruded from a side of the inner rail 11 facing the middle rail 13 by stamping, and two ends of the synchronous hook 242 corresponding to the moving path of the inner/middle rail synchronous stop point 2231 are curved in shape, so that the inner/middle rail synchronous stop point 2231 can be separated from the synchronous hook 242 more easily.

In addition, the synchronizing and locking mechanism 2 of this disclosure further includes a pair of reinforced parts 26 formed on two sides of the middle rail 13 corresponding to the through hole 212 by stamping.

With reference to FIGS. 3 to 6 for the schematic views of using the synchronizing and locking mechanism of a server slide rail 2 of this disclosure, the server is pulled, so that the inner rail 11 is pulled out synchronously, and the synchronous hook 242 and the inner/middle rail synchronous stop point 2231 are engaged with each other to provide a synchronous movement, and define a locked state until the middle rail 13 is pulled outwardly and the jack-up part 2232 falls into the outer rail locking hole 231, and the inner/middle rail synchronous stop point 2231 is released from the synchronous hook 242, and the inner rail 11 is continuously pulled out. On the contrary, when the server slide rail 1 is pushed inwardly for storage, the pull operation part 2223 is pushed manually, so that the inclined plane 22221 moves along the release hook 243 and drives the first elastic plate 222 to swing in an opposite direction, so as to release the inner rail releasing outer rail locking hook 2222 from the limitation of the inner rail locking hole 241 for unlock, and the inner rail 11 and the middle rail 13 are pushed sequentially and retreated into the outer rail. After the aforementioned operation, the effects of synchronizing the inner and middle rails and locking the middle and outer rails can be achieved. Obviously, this disclosure has the effects of simplifying the structure, lowering the manufacturing and assembling cost, and improving the convenience of operation.

What is claimed is:

1. A synchronizing and locking mechanism of a server slide rail, and the server slide rail being sequentially formed by an inner rail, a first slip-assist element, a middle rail, an outer rail and a second slip-assist element, and the synchronizing and locking mechanism comprising:
   a middle rail installing structure, formed on the middle rail by stamping, and comprising an installing part and a through hole, and the through hole having a height limiting stop point inwardly extended from the periphery thereof and, and the installing part having an installing hole;
   an operating plate, having a fixing hole formed at an end thereof and disposed in the installing hole, and the other end of the operating plate having a first elastic plate and a second elastic plate configured and extended side by side with each other, and the first elastic plate having a middle/outer rail locking stop point and an inner rail releasing outer rail locking hook, and an end of the first elastic plate being provided with a pull operation part, and the second elastic plate having an inner/middle rail synchronous stop point and a jack-up part, and the height limiting stop point stopping a swing angle of the first elastic plate to avoid disabling the first elastic plate;
   an outer rail locking structure, formed on the outer rail by stamping, and comprising an outer rail locking hole, such that after being linked and operated by the server slide rail, the middle/outer rail locking stop point is engaged with the outer rail locking hole to define a locked state between the middle rail and the outer rail, and the pull operation part can be pulled manually to release the middle/outer rail locking stop point for unlock; and
   an inner rail synchronous locking structure, formed on the inner rail by stamping, and comprising an inner rail locking hole and a synchronous hook, and the inner rail locking hole being configured to be corresponsive to the first elastic plate, and the synchronous hook being configured to be corresponsive to the second elastic plate, such that after being operated by the server slide rail, the inner rail releasing outer rail locking hook is engaged with the inner rail locking hole to define a locked state between the middle rail and the inner rail, and the inner/middle rail synchronous stop point is engaged with the synchronous hook to form a synchronous movement of the inner rail and the middle rail, and a side of the inner rail locking hole corresponding to the inner rail releasing outer rail locking hook being provided with a release hook, wherein the middle/outer rail locking stop point is protruded from a corresponding side of the outer rail, and the inner rail releasing outer rail locking hook is formed by outwardly extending and bending a outer side edge of the first elastic plate and configured to be corresponsive to a side of the inner rail, and the inner rail releasing outer rail locking hook has an inclined plane, such that when the pull operation part is pulled manually, the inclined plane will move along the release hook to drive the first elastic plate to swing in a opposite direction, so as to separate the inner rail releasing outer rail locking hook from the limitation of the inner rail locking hole for unlock.

2. The synchronizing and locking mechanism of a server slide rail according to claim 1, wherein the jack-up part is disposed on an inner side edge of the second elastic plate, and the inner/middle rail synchronous stop point is disposed on an outer side edge of the second elastic plate, and the inner/middle rail synchronous stop point is extended outwardly after being bent to form a reinforced sidewall by stamping, and the jack-up part normally abuts against a side of the outer rail to swing the second elastic plate towards the inner rail, such that the inner/middle rail synchronous stop point and the synchronous hook are engaged to define a synchronous state.

3. The synchronizing and locking mechanism of a server slide rail according to claim 1, further comprising a reinforced side edge formed on another side edge of the first elastic plate with the inner rail releasing outer rail locking hook by stamping, and the middle/outer rail locking stop point is disposed between the reinforced side edge and the inner rail releasing outer rail locking hook.

4. The synchronizing and locking mechanism of a server slide rail according to claim 1, further comprising an operating hole formed and spaced from a side of the through hole, and the operating hole is configured to be corresponsive to the pull operation part to facilitate an operator's finger to put into the operating hole to carry out an operation of the pull operation part.

5. The synchronizing and locking mechanism of a server slide rail according to claim 1, wherein the synchronous hook is protruded from a side of the inner rail facing the middle rail by stamping, and two ends of the synchronous hook corresponding to a moving path of the inner/middle rail synchronous stop point are curved in shape, such that the inner/middle rail synchronous stop point can be separated from the engagement with the synchronous hook more easily.

6. The synchronizing and locking mechanism of a server slide rail according to claim 1, further comprising a pair of reinforced parts respectively formed on two sides of the middle rail corresponding to the through hole by stamping.

* * * * *